United States Patent
Wu et al.

(10) Patent No.: US 9,768,221 B2
(45) Date of Patent: Sep. 19, 2017

(54) PAD STRUCTURE LAYOUT FOR SEMICONDUCTOR DEVICE

(71) Applicant: TAIWAN SEMICONDUCTOR MANUFACTURING COMPANY, LTD., Hsin-Chu (TW)

(72) Inventors: Shang-Yen Wu, Tainan (TW); I-Chih Chen, Tainan (TW); Yi-Sheng Liu, Yilan (TW); Volume Chien, Sinying (TW); Fu-Tsun Tsai, Tainan (TW); Chi-Cherng Jeng, Madou Township, Tainan County (TW); Ying-Hao Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/929,172

(22) Filed: Jun. 27, 2013

(65) Prior Publication Data

US 2015/0001658 A1    Jan. 1, 2015

(51) Int. Cl.
*H01L 23/52* (2006.01)
*H01L 27/146* (2006.01)
*H01L 23/00* (2006.01)

(52) U.S. Cl.
CPC .......... *H01L 27/1464* (2013.01); *H01L 24/05* (2013.01); *H01L 27/1463* (2013.01); *H01L 27/14634* (2013.01); *H01L 27/14636* (2013.01); *H01L 2224/04042* (2013.01); *H01L 2224/48463* (2013.01); *H01L 2924/13091* (2013.01)

(58) Field of Classification Search
CPC ... H01L 27/146; H01L 27/1464; H01L 23/48; H01L 23/52; H01L 2224/05015; H01L 2224/05552; H01L 2224/5226; H01L 2224/08056; H01L 23/481; H01L 23/585;
(Continued)

(56) References Cited

U.S. PATENT DOCUMENTS 6,143,396 A * 11/2000 Saran .................. H01L 24/03
                                                    257/773
6,232,662 B1    5/2001 Saran
(Continued)

FOREIGN PATENT DOCUMENTS

CN    1601735 A    3/2005
CN    101281893 A    10/2008

OTHER PUBLICATIONS

Volume Chien, I-Chin Chen, Ying-Lang Wang, Hsin-Chi Chen, Ying-Hao Chen and Huang-Ta Huang, "Bonding Pad on a Back Side Illuminated Image Sensor," U.S. Appl. No. 13/763,355, filed Feb. 8, 2013; 29 Pages.

*Primary Examiner* — Cheung Lee
*Assistant Examiner* — Stephen C Smith
(74) *Attorney, Agent, or Firm* — Haynes and Boone, LLP

(57) ABSTRACT

A semiconductor device including a light sensing region disposed on a substrate is provided that includes a bond structure having one or more patterned layers underlying the pad element. The pad element may be coupled to the light sensing region and may be formed in a first metal layer disposed on the substrate. A second metal layer of the device has a first bond region, a region of the second metal layer that underlies the pad element. This first bond region of the second metal layer includes a pattern of a plurality of conductive lines interposed by dielectric. A via connects the pad element and the second metal layer.

19 Claims, 7 Drawing Sheets

(58) Field of Classification Search
CPC .... H01L 23/5226; H01L 24/04; H01L 24/06;
H01L 24/49; H01L 2224/73204; H01L
2224/81385; H01L 2224/48247; H01L
2224/48253; H01L 2224/04026; H01L
24/05; H01L 2924/13091; H01L
2224/04042; H01L 2224/48463
USPC ..... 257/431–440, 459–460, E27.13–E27.137
See application file for complete search history.

(56) References Cited

U.S. PATENT DOCUMENTS

| | | | |
|---|---|---|---|
| 7,301,231 B2 * | 11/2007 | Antol et al. | 257/700 |
| 7,714,443 B2 | 5/2010 | Chen et al. | |
| 7,741,207 B2 | 6/2010 | Hashimoto et al. | |
| 7,741,724 B2 | 6/2010 | Morikawa et al. | |
| 8,178,980 B2 | 5/2012 | Jeng et al. | |
| 8,278,130 B2 * | 10/2012 | Kim | 438/59 |
| 8,399,282 B2 | 3/2013 | Ahn et al. | |
| 8,502,335 B2 * | 8/2013 | Tseng et al. | 257/460 |
| 8,669,602 B2 * | 3/2014 | Hayashi | 257/292 |
| 2002/0179991 A1 | 12/2002 | Varrot et al. | |
| 2005/0093176 A1 | 5/2005 | Hung et al. | |
| 2008/0142975 A1 * | 6/2008 | Ning | 257/758 |
| 2009/0321871 A1 * | 12/2009 | Weng et al. | 257/503 |
| 2010/0164036 A1 * | 7/2010 | Kim | 257/432 |
| 2011/0024867 A1 * | 2/2011 | Tseng et al. | 257/459 |
| 2011/0079920 A1 | 4/2011 | Chaabouni et al. | 257/774 |
| 2011/0227182 A1 * | 9/2011 | Aoki | 257/435 |
| 2012/0199930 A1 * | 8/2012 | Hayashi | 257/435 |
| 2012/0211902 A1 | 8/2012 | Jeng et al. | |
| 2013/0037937 A1 * | 2/2013 | Yang et al. | 257/737 |
| 2013/0134543 A1 | 5/2013 | Tseng et al. | |

\* cited by examiner

PAD STRUCTURE LAYOUT FOR SEMICONDUCTOR DEVICE

BACKGROUND

The semiconductor integrated circuit (IC) industry has experienced rapid growth. Technological advances in IC materials and designs have produced generations of ICs each having smaller and more complex circuits. In the course of evaluation, the geometry size or technology node (e.g., smallest component or line that can be imaged) has decreased and the number of layers making up the device has increased.

Interconnect structures of semiconductor devices connect the various active devices and circuits of the devices to a plurality of conductive pads on the external surface of the die. Multi-level interconnect structures have been developed that accommodate the advances in active-device density by routing conductive paths between the devices and the pads on the die. Multi-level interconnect structures arrange the metallization lines in multiple layers, which may be electrically isolated by surrounding dielectric material. Any number of interconnect levels may be used; typically five or more or more individual interconnect levels of conductive paths are provided to accommodate the active-device density. The conductive paths of the multi-level interconnect structures terminate in bond pads at the surface of the substrate. The bond pads are relatively large metal areas distributed about the device. Bond pads are used to establish electrical contact between the devices of the substrate and an external point such as a package substrate or a probe pin (e.g., for wafer acceptance testing).

The present disclosure relates to a method for forming a pad structure on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

It is noted that the term "bond structure" as used herein to describe the structure including a pad element, also referred to as a bond pad (or the conductive element to which an external connection via a bonding element such as a wire bond is formed) and the conductive elements connected to and vertically aligned with (e.g., under) the pad element. The conductive elements and/or pad of the bond structure may be a portion of a multi-layer interconnect (MLI). The term "pattern" (or "patterned") does not indicate any specific method of formation of a structure but indicates a feature that has a provided configuration of lines (e.g. conductive lines) and spaces (e.g., dielectric).

Figure 1:
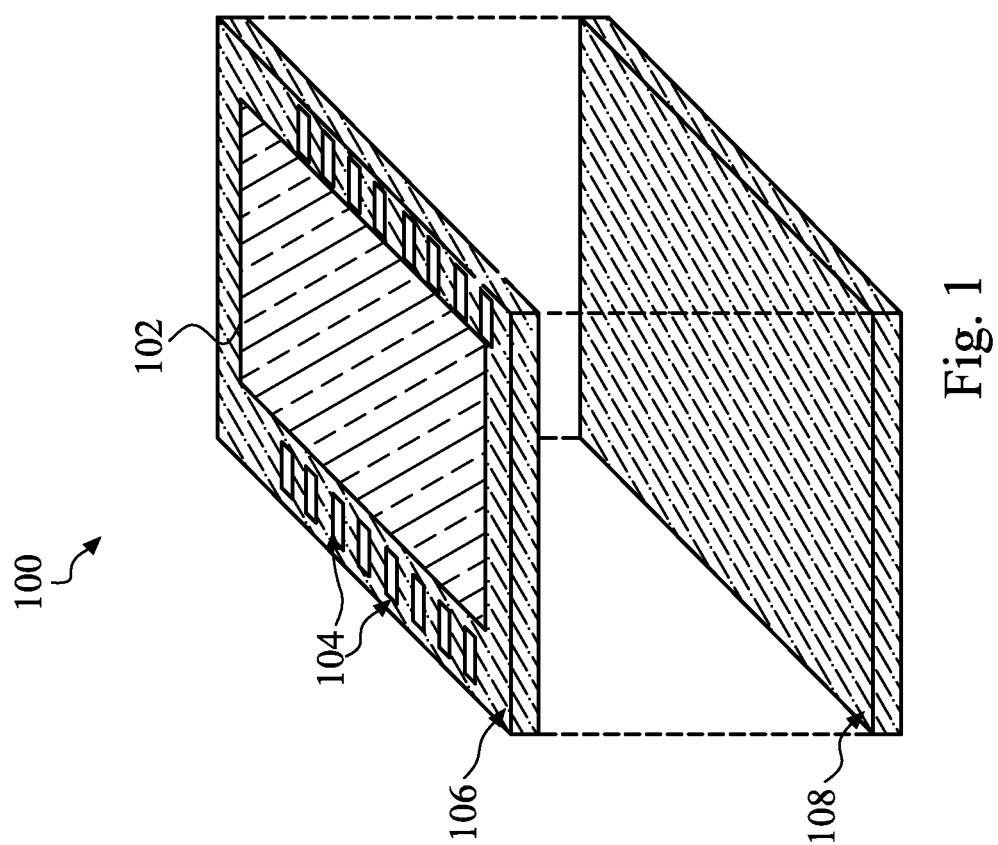
FIG. 1 is a perspective view of a diagrammatic representation of an embodiment of a device having features according to one or more aspects of the present disclosure.

Illustrated in FIG. 1 is a device 100 having an active region 102 and a plurality of pad elements 104 disposed on a substrate 106. The device 100 is a semiconductor device. In particular, the device 100 may include an image sensor. The semiconductor device may also include an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors; image sensors; micro-electro mechanical devices (MEMS); and/or other suitable devices. It is understood that the figures may have been simplified for a better understanding of the inventive concepts of the present disclosure. Accordingly, it should be noted that additional features may be included and some features may be described only briefly herein.

In an embodiment, the substrate 106 includes silicon. The substrate 106 may alternatively or additionally include other elementary semiconductor material such as germanium, and/or diamond. The substrate 106 may include a compound semiconductor material such as silicon carbide, gallium arsenic, indium arsenide, and/or indium phosphide; the substrate 106 may include an alloy semiconductor such as silicon germanium, silicon germanium carbide, gallium arsenic phosphide, and/or gallium indium phosphide. The substrate 106 may include various p-type doped regions and/or n-type doped regions. All doping may be implemented using a process such as ion implantation or diffusion in various steps and techniques. The substrate 106 may include conventional isolation features (e.g., shallow trench isolation or LOCOS features), known in the art, to separate different devices formed in the substrate 106. The substrate 106 may include other features such as an epitaxial layer, a semiconductor on insulator (SOI) structure, or combinations thereof.

The device 100 also includes a substrate 108. The substrate 108 and the substrate 106 may be distinct substrates bonded together to form the device 100. In other embodiments, the "substrates" 108 and 106 may denote regions of a single substrate having a plurality of devices formed thereon. Regardless of the processing, typically an electrical and/or physical connection is provided between elements on the substrates 106 and 108. In an embodiment, the substrate 108 includes silicon. The substrate 108 may alternatively or additionally include other elementary semiconductor material such as germanium, and/or diamond. The substrate 108 may include a compound semiconductor material such as silicon carbide, gallium arsenic, indium arsenide, and/or indium phosphide; the substrate 108 may include an alloy semiconductor such as silicon germanium, silicon germanium carbide, gallium arsenic phosphide, and/or gallium indium phosphide. The substrate 108 may include various p-type doped regions and/or n-type doped regions. All doping may be implemented using a process such as ion implantation or diffusion in various steps and techniques. The substrate 108 may include conventional isolation features (e.g., shallow trench isolation or LOCOS features), known in the art, to separate different devices formed in the substrate 108. The substrate 108 may include other features such as an epitaxial layer, a semiconductor on insulator (SOI) structure, or combinations thereof.

In an embodiment, the substrate 106 includes an image sensor element and the substrate 108 includes semiconductor devices operable to interface with the image sensor element of substrate 106. In a further embodiment, the semiconductor devices of substrate 108 are logic devices.

In an embodiment, the active region 102 includes a plurality of pixels each having a sensor element for the device 100, operable to perform as an image sensor. The sensor elements may be formed within substrate 106 by suitable processes. For example, the sensor elements (or pixels) formed within the semiconductor substrate may each include a light-sensing region (or photo-sensing region), which may be a doped region having N-type and/or P-type dopants formed in the semiconductor substrate 106 by a method such as diffusion or ion implantation processes. The sensor elements may include photodiodes, complimentary metal-oxide-semiconductor (CMOS) image sensors, charged coupling device (CCD) sensors, active sensor, passive sensor, and/or other sensors diffused or otherwise formed in the substrate 106. The active region 102 may include a plurality of pixels disposed in a sensor array or other proper configuration. In an embodiment, the active region 102 is disposed on a backside surface of the substrate 106 and extends into the semiconductor substrate 106. In a further embodiment, the substrate 106 is thinned to provide suitable transmission for such a backside illuminated sensor. In another embodiment, the active region 102 may be disposed above the front-side surface of the substrate 106.

The pad elements 104 are disposed on the peripheral region of the substrate 106 including the active region 102. However, in other embodiments other configurations may be possible.

In an embodiment, the pad elements 104 are conductive bond pads, for example, including a solid contiguous pad of conductive material. A solid contiguous pad of conductive material may be in a polygon shape such as the rectangular shape illustrated in FIG. 1. A solid and contiguous pad of conductive material may be referred to herein as a structure having a conductive density of approximately 100%. The term "conductive density" refers to the ratio of the total conductive area within a structure (e.g., pad) to the total area of that structure. Exemplary conductive materials of the pad elements 104 include copper, gold, aluminum, alloys thereof, tungsten, and/or other suitable conductive materials.

The pad elements 104 may provide an interconnection to surrounding circuit or device elements including those elements of the active region 102 and/or the substrate 108. In an embodiment, the pad elements 104 are input/output (I/O) pads. In an embodiment a bond element such as a wire bond is provided to the pads 104. Exemplary wire bonds that may be disposed on the pads 104 include wedge bonds, ball bonds, ball-wedge bonds, and/or other suitable conductive elements providing physical and/or electrical connection to the pads 104. The bond element may be connected to an adjacent integrated circuit (IC), a printed circuit board (PCB), a package, a module, a leadframe, and/or other suitable external elements. The pad element 104 may be defined by an opening in a passivation or dielectric layer disposed on the surface of the device 100.

The pad elements 104 and/or the pixels 102 may be operably and electrically coupled to semiconductor device elements formed on substrate 106 and/or substrate 108. In an embodiment, the substrate 108 includes logic devices and is bonded to the substrate 106, which includes the active region 102 (e.g., pixels). It is noted that while the device 100 is illustrated as a 3D structure having a plurality of substrates (106, 108) stacked, the present disclosure is not necessarily limited thereto. Any device having a bond structure may benefit from aspects of the present disclosure. Bond structure includes a pad element (also referred to as a bond pad) and underlying conductive and/or insulating layers as described below.

The semiconductor device 100 further includes a multi-layer interconnect (MLI). The MLI is coupled to elements (e.g., sensor elements) of the active region 102. For example, the elements of the active region may be operable to properly respond to illuminated light (imaging radiation) and communicate such via the MLI. The MLI may include conductive materials, such as metals as discussed below. The MLI interconnect may include the pad elements 104 and the conductive layers interconnected to the pad elements 104. For example, the MLI may include a bond structure or bond region portion that includes pad elements 104. MLI are discussed in further detail below with reference to FIG. 2.

Figure 2:
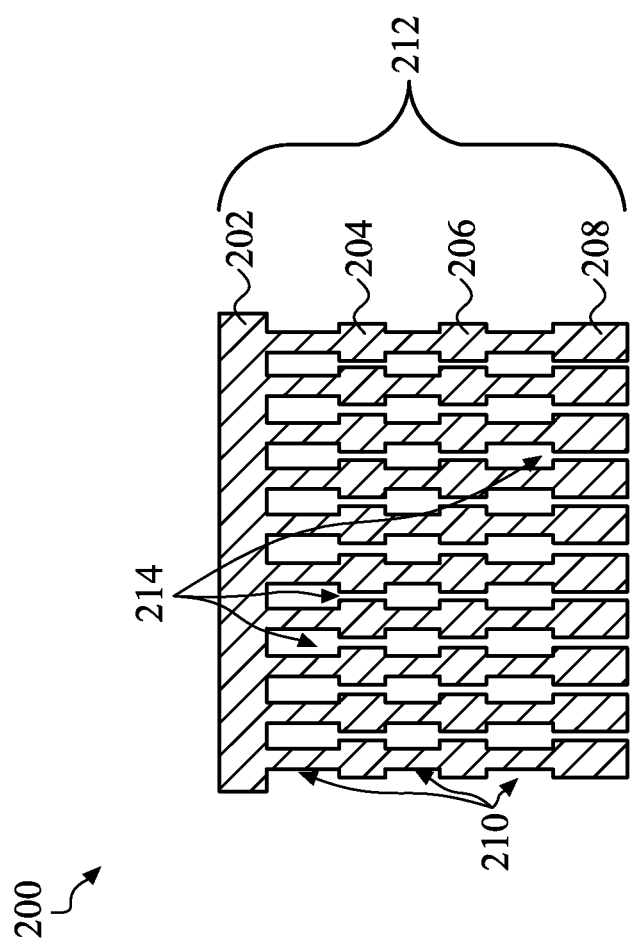
FIG. 2 is a cross-sectional view of an embodiment of a bond structure of a device according to one or more aspects of the present disclosure.

Referring now to FIG. 2, illustrated is a cross-sectional view of a bond structure 200. In an embodiment, the bond structure 200 is disposed on a substrate having a semiconductor device, such the device 100, described above with reference to FIG. 1.

The bond structure 200 may be part of an MLI structure disposed on a substrate. The bond structure 200 includes a pad element 202 and a plurality of underlying conductive lines 212. The pad element 202 may be part of a MLI structure formed on a substrate including, for example, an exposed portion of a metal layer of the MLI structure to which a wire bond may be provided, as discussed below. The conductive lines 212 may be portions of the conductive lines of the MLI that are in this bond region, in other words, underlying the bond element or pad.

In an embodiment, the pad element 202 may be substantially similar to the pad element 104, discussed above with reference to FIG. 1. The pad element 202 may be referred to as a bond pad. The pad element 202 may be exposed such that a wire bond may be provided to the pad element 202. In an embodiment, a wedge bond, ball bond, or other suitable type of bond is disposed on the pad element 202. The pad element 202 may provide a conductive surface in an opening of surrounding dielectric and/or passivation material upon which the bond is formed. The pad element 202 may be a region (e.g., rectangular opening in a surrounding passivation layer) that has 100% conductive density.

The bond structure 200 includes the pad element 202 as discussed above, and also the underlying conductive, connective layers 212 including layer 204, layer 206, and layer 208 and interposing vias 210.

The layers 204, 206, and/or 208 may include a conductive material such as, for example, aluminum, copper, copper-based alloys, and/or other suitable materials including those discussed below. The layers 204, 206, and/or 208 may include liner or barrier layers. In an embodiment, layer 208 is a top metal layer of a device formed on a substrate. It is noted that layers 204, 206, and 208 are illustrative only and not intended to limit the present disclosure to any number of conductive (e.g., metal) layers. For example, in other embodiment, any number of conductive layers may interpose pad 202 and a top metal layer, represented by conductive line 208.

In an embodiment, the MLI, including the pad element 202 and/or the layers 204, 206, and 208, includes aluminum interconnects for example, conductive material such as aluminum, aluminum/silicon/copper alloy, titanium, titanium nitride, tungsten, polysilicon, metal silicide, or combinations thereof. Aluminum interconnects may be formed by a process including physical vapor deposition (or sputtering), chemical vapor deposition (CVD), or combinations thereof. Other manufacturing techniques to form the metal interconnect may include photolithography processing and etching to pattern the conductive materials for vertical (via and contact) and horizontal connects (conductive line). In other embodiments, copper multilayer interconnects may be used and include copper, copper alloy, titanium, titanium nitride, tantalum, tantalum nitride, tungsten, polysilicon, metal silicide, or combinations thereof. The copper multilayer interconnect may be formed by a technique including CVD, sputtering, plating, or other suitable processes. In some embodiments, a damascene process such as dual damascene processing or single damascene processing may form the interconnects.

As stated above, each of the plurality of conductive layers 212 of the bond region is connected to an adjacent layer by via or plug structures 210. The via structure 210 also connects the bond element 202 and the nearest conductive layer 204. The via structures 210 may include a conductive material such as, for example, tungsten, copper, aluminum, and/or other suitable material. The via structures 210 may provide for electrical interconnection to the pad element 202. The via structures 210 may also provide for structural support for one or more of the layers 202, 204, 206, and/or 208.

The MLI including the bond structure 200 also includes an interlayer dielectric (ILD) 214 that interposes the conductive lines and vias. The ILD 214 may also coplanar with the conductive material in patterned layers 204, 206, and 208 in the bond structure 200 or bonding region, as discussed below. The ILD 214 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 214 may be formed by a technique including spin-on, CVD, sputtering, or other suitable processes.

One or more of the layers 204, 206, and 208 may be a patterned conductive layer, such that it has a conductive density of less than approximately 100%. In other words, dielectric material 214 may interpose conductive material within layer 204, 206 and/or 208 of the bond structure 200. As such, the dielectric material 214 is co-planar and interposes lines of the patterned conductive material of one or more of 204, 206, and 208. Top views of exemplary patterned conductive layers having a conductive density of less than approximately 100% are illustrated in FIGS. 3a-3l, discussed below.

Referring now to the embodiment shown in FIGS. 3a-3l, illustrated are top views of patterned conductive layers or simply patterned layers. The patterned conductive layers may be portions of MLI interconnect in a bond region; in other words, the patterned conductive lines make up a bond structure. The patterned conductive layers illustrated in FIGS. 3a-3l may be provided below a pad element such as the pad element 202, described above with reference to FIG. 2, or pad element 104, described above with reference to FIG. 1. In other words, one or more of conductive layers 204, 206, and/or 208 may be patterned conductive layers as illustrated in FIGS. 3a-3l.

Figure 3B:
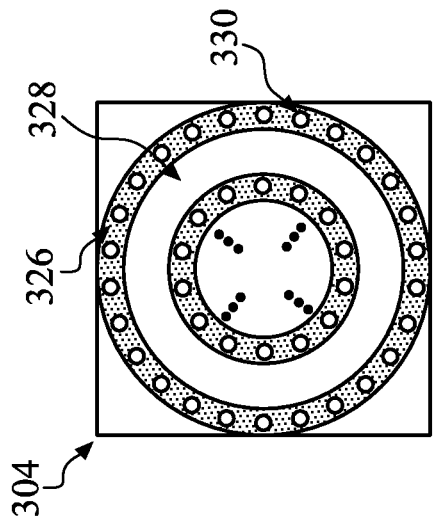
FIGS. 3a-3l illustrate views of a plurality of exemplary embodiments of patterned layers of a bond structure according to aspects of the present disclosure and that may be used in FIGS. 1, 2, 4 and/or 5.
Figure 3D:
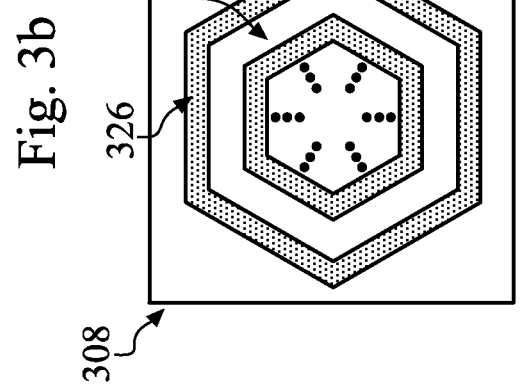
Figure 3A:
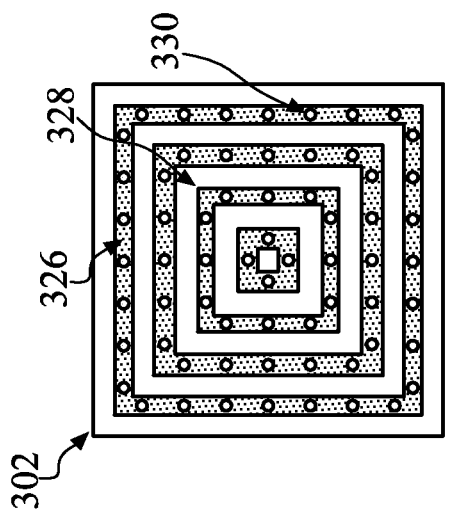
Figure 3C:
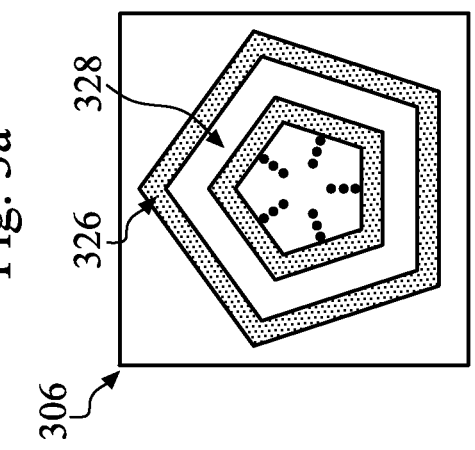
Figure 3F:
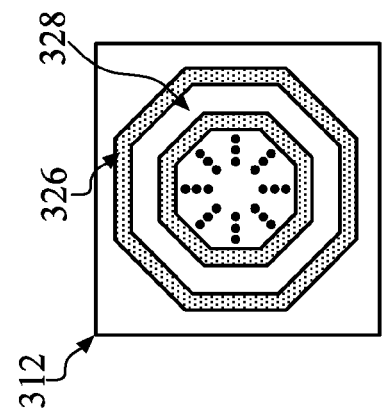
Figure 3E:
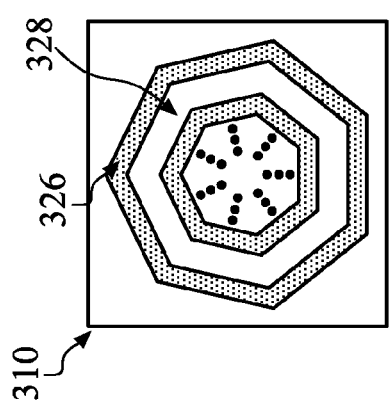
Figure 3H:
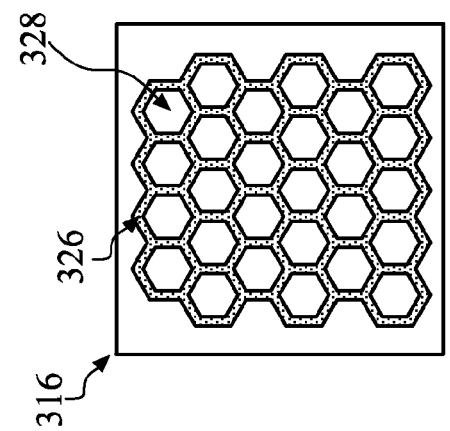
Figure 3G:
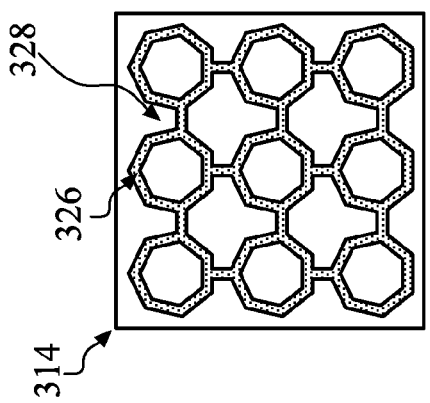
Figure 3J:
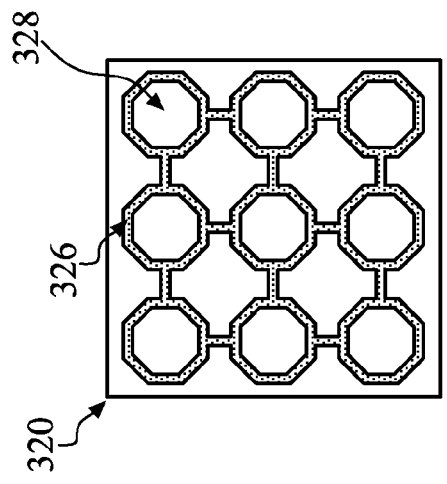
Figure 3L:
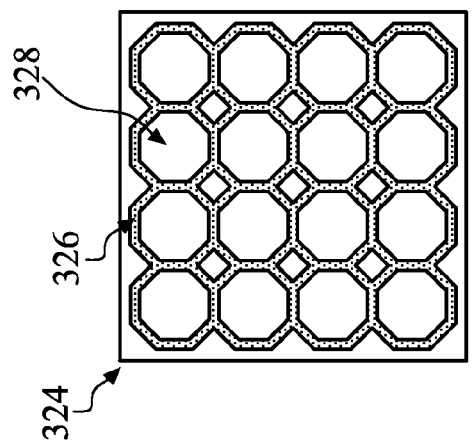
Figure 3I:
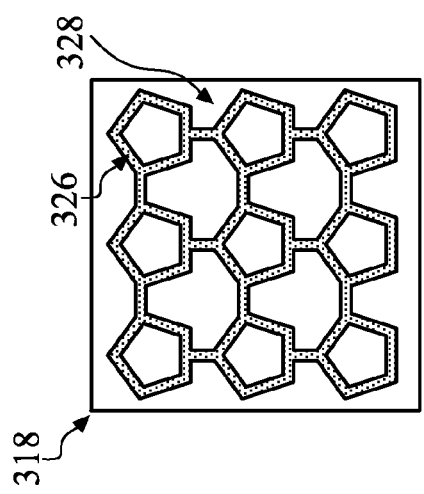
Figure 3K:
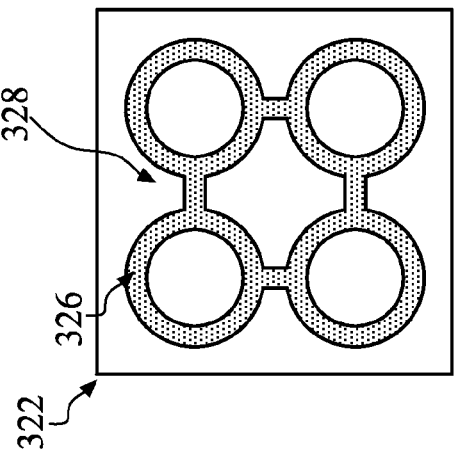

Referring to FIG. 3a, illustrated is a patterned layer 302. The patterned layer 302 may be a layer of an MLI structure and disposed under a pad element in a bond structure (e.g., in a bond region or part of a bond structure). The patterned layer 302 includes patterned conductive lines 326 interposed by dielectric material 328. In an embodiment, the conductive lines 326 include, for example, conductive material such as aluminum, aluminum/silicon/copper alloy, titanium, titanium nitride, tungsten, polysilicon, metal silicide, copper, copper alloy, titanium, titanium nitride, tantalum, tantalum nitride, tungsten, polysilicon, metal silicide, combinations thereof, and/or other suitable materials. The patterned layer 302 may be formed by suitable processes such as, for example, physical vapor deposition (or sputtering), plating, chemical vapor deposition (CVD), photolithography processing, etching to pattern the formed conductive materials. In some embodiments, damascene processes may be used. The dielectric material 328 may be an interlayer dielectric (ILD). The dielectric material 328 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric material 328 may be formed by a suitable technique including spin-on, CVD, sputtering, and/or other suitable processes. The patterned layer 302 illustrates via landings 330 that provide a connection between a via, such as the vias 210 described above with reference to FIG. 2, and the conductive lines 326. The patterned layer 302 may be implemented in a bond structure underlying a pad element, such as, for example, as one or more of layers 204, 206 and 208 of the pad element 200, described above with reference to FIG. 2.

FIGS. 3b, 3c, 3d, 3e, 3f, 3g, 3h, 3i, 3j, 3k, and 3l are illustrative of patterned layers 304, 306, 308, 310, 312, 314, 316, 318, 320, 322, and 324 respectively. Each of patterned layers 304, 306, 308, 310, 312, 314, 316, 318, 320, 322, and 324 also includes patterned conductive lines 326 and dielectric 328, substantially similar to as discussed above with reference to FIG. 3a, except with varying patterns. It is noted that via interconnections may not be illustrated but may be disposed on the conductive lines 326.

The patterned layers provide conductive (e.g., metal) lines interposed by dielectric spaces. In an embodiment, the conductive lines 326 provide conductive (metal) material arranged in a manner that forms a pattern of concentric shapes. See, e.g., FIGS. 3a, 3b, 3c, 3d, 3e and 3f. In embodiments, the conductive lines 326 may provide conductive (metal) material that forms a pattern having a plurality of shapes, such as, for example polygons (see FIGS. 3g, 3h, 3i, 3j, 3l). The shapes may be arranged in a repeating pattern such as an array (see FIGS. 3g, 3h, 3i, 3j, 3k, 3l).

In an embodiment, patterned layer 302 is adjacent patterned layer 304 (e.g., overlying or underlying) in a bond structure. In an embodiment, patterned layer 306 is adjacent patterned layer 308 (e.g., overlying or underlying) in a bond structure. In an embodiment, patterned layer 310 is adjacent patterned layer 312 (e.g., overlying or underlying) in a bond structure. In an embodiment, patterned layer 314 is adjacent patterned layer 316 (e.g., overlying or underlying) in a bond structure. In an embodiment, patterned layer 318 is adjacent patterned layer 320 (e.g., overlying or underlying) in a bond structure. In an embodiment, patterned layer 322 is adjacent patterned layer 324 (e.g., overlying or underlying) in a bond structure.

It should be noted that the patterned layers 302, 304, 306, 308, 310, 312, 314, 316, 318, 320, 322, and 324 are exemplary only and not intended to be limiting. As discussed in further detail below with reference to FIG. 5, the pattern of a layer of a bond structure (e.g., those patterns illustrated in patterned layers 302, 304, 306, 308, 310, 312, 314, 316, 318, 320, 322, and 324) may be selected to efficiently reduce processing issues. For example, providing MLI structures (including bond structures) in semiconductor devices such as image sensors may require various polishing processes such as chemical mechanical polishing (CMP) processes to fabricate the stack-up of layers. The result of the CMP process may indicated by a planarization parameter, which is an indication of the planarity of the target surface. One planarization parameter is dishing. With a plurality of solid conductive pads provided in a stack-up, undesired dishing can result. The dishing can be inherited layer by layer as the MLI structure is formed, which can result in significant increases in dishing as the stack grows and culminates at the top metal layer. In an embodiment, the top metal layer may be required for bonding (see FIG. 4) and as such the dishing can affect the bond ability and yield. In contrast, the use of patterned layers such as described herein can reduce undesired effects of processing. Every conductive layer of an MLI in the bond region/structure may be selected such as to not inherit any dishing of the previously formed layer, while maintaining bonding strength, conductivity, suitable layout for connection to adjacent layers (e.g., vias) and/or other suitable performance criteria. Selection of the pattern type to implement in the pattern layer(s) of the bond structure may be determined by simulation, experimental data, design data and requirements, and/or other suitable means.

Figure 4:
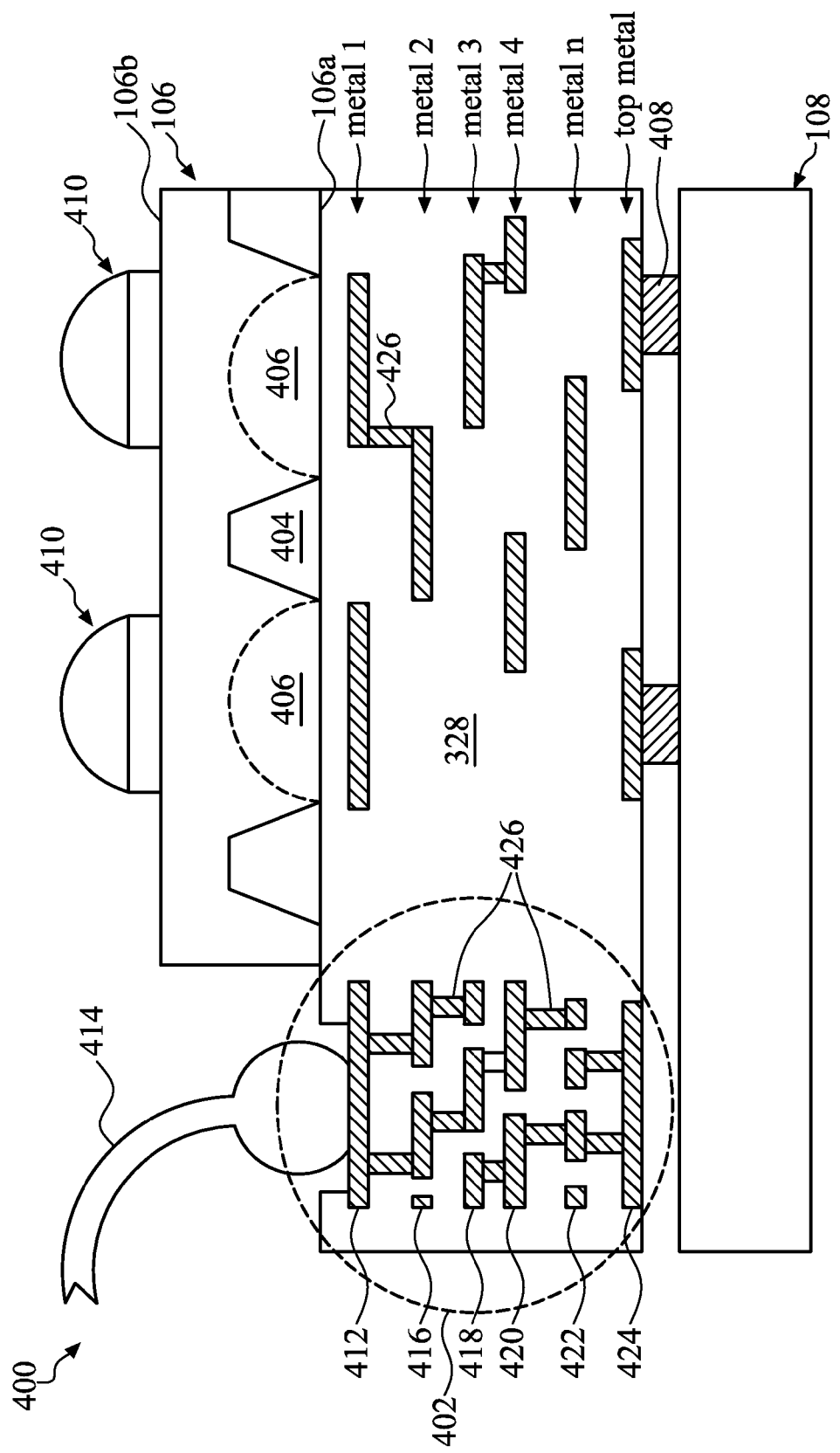
FIG. 4 is a cross-sectional view of an embodiment of a three-dimensional (3D) image sensor device having a bond structure according to one or more aspects of the present disclosure.

Referring now to FIG. 4, illustrated is an image sensor device 400. In the illustrated embodiment, the image sensor device 400 is a back-side illuminated sensor (BSI). However, other configurations may be possible. The image sensor device 400 includes a bond structure 402 that includes a patterned layer, such as, for example, one or more of the patterned layers discussed above with reference to FIGS. 3a-3l.

The image sensor device includes a first substrate 108 and a second substrate 106. In an embodiment, the substrate 106 includes silicon. The substrate 106 may alternatively or additionally include other elementary semiconductor material such as germanium, and/or diamond. The substrate 106 may also include a compound semiconductor material such as silicon carbide, gallium arsenic, indium arsenide, and/or indium phosphide; the substrate 106 may include an alloy semiconductor such as silicon germanium, silicon germanium carbide, gallium arsenic phosphide, and/or gallium indium phosphide. The substrate 106 includes isolation features 404. The isolation features 404 may be shallow trench isolation (STI) features as illustrated, local oxidation of silicon (LOCOS) features, and/or other suitable isolation features.

The substrate 106 also includes light-sensing regions or pixels 406. The light-sensing regions may include various p-type doped regions and/or n-type doped regions. All doping may be implemented using a process such as ion implantation or diffusion in various steps and techniques.

The image sensor device 400 also includes a substrate 108. The substrate 108 may be bonded to the substrate 106 using bonding features 408. The bonding features 408 may be features providing physical and/or electrical interconnection between devices on the substrate 106 and 108. In an embodiment, the substrate 108 includes silicon. The substrate 108 may alternatively or additionally include other elementary semiconductor material such as germanium, and/or diamond. The substrate 108 may also or alternatively include a compound semiconductor material such as silicon carbide, gallium arsenic, indium arsenide, and/or indium phosphide; or an alloy semiconductor such as silicon germanium, silicon germanium carbide, gallium arsenic phosphide, and/or gallium indium phosphide.

In an embodiment, the substrate 108 includes logic devices operable to interface with elements disposed on substrate 106. The substrate 108 may also include semiconductor devices such as, an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors; image sensors; and/or other suitable devices. Thus, the substrate 108 may include various p-type doped regions and/or n-type doped regions, isolation features (e.g., shallow trench isolation or LOCOS features), epitaxially grown regions, gate structures, interconnect features, and/or other complementary metal-oxide-semiconductor (CMOS) technology features. The devices formed on the substrate 108 may be interconnected using a multi-layer interconnect (MLI) structure. In an embodiment, the bonding feature 408 is connected to a top layer of an MLI structure disposed on the substrate 108 and interconnected to semiconductor devices (e.g., logic devices) disposed thereon.

Referring again to substrate 106, the light-sensing regions 406 may be formed within substrate 106 by suitable processes. For example, the sensor elements (or pixels) formed within the semiconductor substrate may each include a light-sensing region (or photo-sensing region), which may be a doped region having N-type and/or P-type dopants formed in the semiconductor substrate 106 by a method such as diffusion or ion implantation processes. The light-sensing regions 406 may include photodiodes, complimentary metal-oxide-semiconductor (CMOS) image sensors, charged coupling device (CCD) sensors, active sensor, passive sensor, and/or other sensors diffused or otherwise formed in the substrate 106. The substrate 106 may include any plurality of light-sensing regions 406 disposed in a sensor array or other proper configuration. The light-sensing regions may be an implanted region formed on a surface and extending into the substrate 106.

It is noted that the substrate 106 has a front side 106a and a backside 106b. The multiple layers of interconnect features including a plurality of metal lines are formed on the front side 106a of the substrate 106, as discussed below. Lenses and color filters 410 are formed over the backside 106b of the substrate 106 for color imaging applications. The lens and color filters 410 may provide operability such that the backside-illuminated light can be focused on the light-sensing regions 406 through the backside 106b. Thus, the device 400 may be a back-side illuminated sensor device.

As typical of CMOS semiconductor devices, a plurality of conductive layers, typically referred to as metal layers, is disposed on the substrate 106. These conductive layers make up a MLI. In particular, the metal layers interposed by dielectric material are disposed on a front surface 106a of the substrate 106. Any number of metal layers is possible. The metal layers of the MLI are annotated in FIG. 4 for ease of reference and include Metal 1 and a Top Metal, as well as a plurality of metal layers interposing Metal 1 and a Top Metal. The metal layers are connected through various conductive plugs or vias and provide interconnection to various devices including, for example, image sensing regions 406. As stated above, the plurality of metal lines and the interconnecting vias may be referred to as a multi-layer interconnect (MLI) structure. The MLI also includes the interposing dielectric 328. The dielectric material 328 may be an interlayer dielectric (ILD). The dielectric material 328 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials formed on the front surface 106a. The dielectric material 328 may be formed by a technique including spin-on, CVD, sputtering, or other suitable processes.

A portion of the MLI structure is disposed in a bond region and provides a bond structure 402 for the device 400. The bond structure 402 includes a pad element 412. The pad element 412 may be a portion of the Metal 1 layer (e.g., the closest metal line of the MLI structure to the substrate 106). A bond feature 414 is disposed on the pad element 412. The bond feature 414 may be a wedge bond, a ball bond, a ball-wedge bond, and/or other suitable conductive elements providing physical and/or electrical connection to the device 400 via the pad element 412. The bond feature 414 may be connected to an adjacent integrated circuit (IC), a printed circuit board (PCB), a package, a module, a leadframe, and/or other suitable external elements. The pad element 412 may be defined by an opening in the dielectric layer 328 disposed on the surface of the substrate 106a.

The pad element 412 may be a continuous conductive region of material of the Metal 1 interconnect layer. For example, the pad element 412 may be a solid continuous pad of conductive material 412 having a conductive density of approximately 100%, which is formed concurrently with the Metal 1 layer of the MLI structure. In a further embodiment, the pad element is rectangular shape having approximately 100% conductive density.

The bond structure 402 further includes additional layers of the multi-layer interconnect (MLI) underlying and interconnected to the pad element 412. Layers 416, 418, 420, 422, and 424 include a conductive material such as aluminum, aluminum/silicon/copper alloy, titanium, titanium nitride, tungsten, polysilicon, metal silicide, copper, copper alloy, titanium, titanium nitride, tantalum, tantalum nitride, tungsten, polysilicon, metal silicide, combinations thereof, and/or other suitable materials. The layers 416, 418, 420, 422, and 424 may be formed by suitable processes such as, for example, physical vapor deposition (or sputtering), plating, chemical vapor deposition (CVD), photolithography processing, etching to pattern the formed conductive materials. One or more of layers 416, 418, 420, 422, and 424 are patterned layers having a conductive density of less than approximately 100%. Each patterned layer includes a patterned conductive material (e.g., lines) having interposing, co-planar, dielectric material. Exemplary patterns for the patterned conductive layers suitable for layers 416, 418, 420, 422, and 424 are described above with reference to FIGS. 3a-3l, which are presented by way of example and not intended to be limiting.

As illustrated, layer 416 may be a patterned conductive layer co-planar with the Metal 2 layer formed on the substrate 106; layer 418 may be a patterned conductive layer co-planar with the Metal 3 layer formed on the substrate 106; layer 420 may be a patterned conductive layer co-planar with the Metal 4 layer formed on the substrate 106; layer 422 may be a patterned conductive layer co-planar with the Metal n layer formed on the substrate 106; layer 424 may be a patterned conductive layer co-planar with the Top Metal layer formed on the substrate 106. Any number of layers may be provided. One or more of the patterns of layers 416, 418, 420, 422, and 424 may be different than patterns of the other of layers 416, 418, 420, 422, and 424.

In an embodiment, the top metal layer 424 of the bond structure 402 is a conductive region having approximately 100% conductive density. In a further embodiment, the top metal layer 424 of the bond structure 402 is bonded to the substrate 108 using a bonding feature, such as feature 408. In other embodiments, the top metal layer 424 of the bond structure 402 is patterned conductive layer having a conductive density of less than approximately 100%.

Thus, provided in FIG. 4 is a backside illuminated sensor device 400 having a bond structure 402 with one or more layers underlying the bond element 412. These layers underlying the bond element 412 are patterned layers such that they have a pattern of conductive features such as, having a conductive lines/element coplanar with interposing dielectric material. Thus, the layers underlying the bond element 412 have a conductive density of less than approximately 100% in their region underlying and vertically aligned with the pad element 412.

Figure 5:
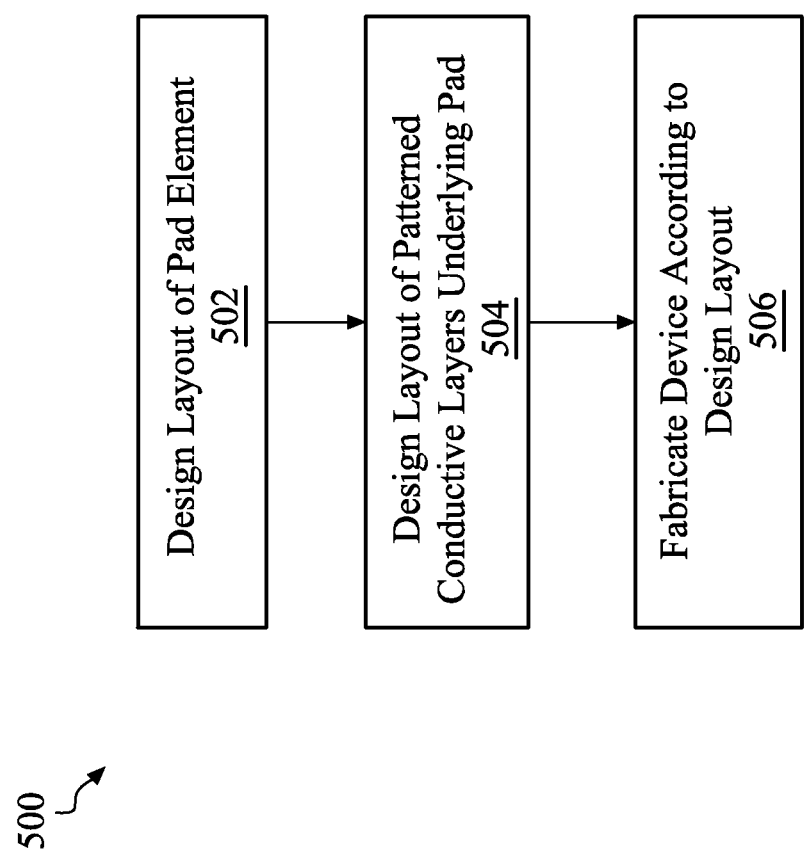
FIG. 5 is a flow chart that illustrates an embodiment of a method of fabricating a bond structure according to one or more aspects of the present disclosure.

Referring to FIG. 5, illustrated is a method 500 of forming a semiconductor device including a bond structure according to one or more aspects of the present disclosure. The method 500 may be used to fabricate the device 100, described above with reference to FIG. 1; the bond structure 200, described above with reference to FIG. 2; a device including any one of the patterned layers illustrated in FIGS. 3a-3l; and/or the device 400, described above with reference to FIG. 4.

The method 500 begins at block 502 where a design layout of a pad element is determined. The pad element design may be a continuous pad of conductive material having a 100% conductive density. In an embodiment, the pad element design is provided in a Metal 1 or lowest conductive layer disposed on a substrate of the device. The design layout may be expressed in a file format readable by layout and/or mask data preparation tools operable to form photomasks or deliver instructions to writer tools such as, e-beam lithography tools. Exemplary file formats include GDSII, DFII, and/or other file formats.

The method 500 then proceeds to block 504 where a design layout of one or more layers vertically aligned with the pad element are provided. The layers vertically aligned with the pad element and the pad element make up the bond structure, as discussed above. The layers may include a layer that has a pattern of conductive material with interposing dielectric material co-planar with the conductive material. In an embodiment, the patterned conductive material is vertically aligned with the bond element, described above with reference to block 502, for example, physically underlying the bond element in the fabricated device. The region underlying the bond element may have a conductive density of less than approximately 100%. Exemplary patterned conductive material layers used for the bond structure are provided in FIGS. 3*a*-3*l*. The design layout of the patterned layer for the bond structure may be provided in a metal layer associated with the device (e.g., metal 2, metal 3, and so forth). The design layout may be expressed in a file format readable by layout and/or mask data preparation tools operable to form photomasks or deliver instructions to writer tools such as, e-beam lithography tools. Exemplary file formats include GDSII, DFII, and/or other file formats.

Block 504 may determine the suitable pattern for the patterned layers using simulation, experimental data, design requirements (e.g., databases), and/or other suitable tools. The pattern may be selected such as to reduce fabrication issues such as dishing during the planarization of the device. The specific pattern may also be selected based on providing connectivity to one or more adjacent layers (e.g., by implementing via structures). The specific pattern may also take into account the patterns of adjacent layers of the bond structure for example, such as to not inherit any undesired processing affect (e.g., dishing) of the previously formed layer, while maintaining bonding strength, conductivity, suitable layout for connection to adjacent layers (e.g., vias) and/or other suitable performance criteria.

In one embodiment, the design layout such as described in blocks 502 and/or 504, may be determined by an information handling system such as a computer, server, workstation, handheld computing device, or other suitable computing device or collection of communicatively coupled computing devices. The system can include a processor that is communicatively coupled to a system memory, a mass storage device, communication modules, and/or other tools. The system memory provides the processor with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on a mass storage device of the information handling system. Examples of mass storage devices may include hard discs, optical disks, magneto-optical discs, solid-state storage devices, and/or a variety other mass storage devices known in the art. These instructions may provide for simulations and/or experimental data used to determine the layout of one or more features of the device to be fabricated, including determining a suitable pattern for the patterned layers of the bond structure.

The method 500 then proceeds to block 506 where a device is fabricated according to the design layout of the pad and patterned conductive elements of the bond structure. The device may be substantially similar to the device 100, described above with reference to FIG. 1 and/or the device 400, described above with reference to FIG. 4. The device may be fabricated on a semiconductor substrate, such as, for example, the substrate 106 discussed above with reference to FIGS. 1 and 4.

Thus, it will be appreciated that in an embodiment a semiconductor device is provided. The semiconductor device includes a light sensing region disposed on a substrate. The device further includes a pad element coupled to the light sensing region; the pad element may be formed in a first metal layer disposed on the substrate. A second metal layer is disposed on the substrate. The second metal layer has a first bond region, a region of the second metal layer that underlies the pad element. This first bond region of the second metal layer includes a pattern of a plurality of conductive lines interposed by dielectric. A via connects the pad element and the second metal layer.

In a further embodiment, the light sensing region includes a doped region extending from a first surface of the substrate into the substrate. In an embodiment, the first metal layer is disposed nearer a surface of the substrate than the second metal layer. In some embodiments, the pad element, also referred to as a bond pad, is disposed on a peripheral region of the substrate. A wire bond may be attached to the pad element.

In some further embodiments, a third metal layer is disposed on the substrate and has a second bond region that underlying the pad element. The second bond region of the third metal layer includes a second pattern of a plurality of conductive lines interposed by dielectric, the second pattern is different than the first pattern. In the embodiment, a second via connects the third metal layer and the second metal layer. In yet another embodiment, a top metal layer is disposed on the substrate further from the substrate top surface than the first and second metal layers. A second substrate can be bonded to the top metal layer of the substrate having the light sensing region.

In another of the broader embodiments discussed herein, described is a back-side illuminated sensor device. The device includes a first substrate having a first surface and an opposing second surface. A lens is disposed on the first surface, operable to direct an incident radiation beam toward a light sensing region disposed in the first substrate. A multi-layer interconnect (MLI) disposed on the first surface of the first substrate; the MLI includes a first metal layer, a second metal layer and a plurality of vias connecting the first and second metal layer. A bond structure is disposed on a peripheral region of the first substrate, the bond structure includes a pad element co-planar with the first metal layer of the MLI and a pattern of conductive material coplanar with the second metal layer of the MLI. This pattern underlies the pad element provides a region underlying the pad element that has a conductive density of less than 100%. At least one of the plurality of vias connect the pad element and the pattern of conductive material.

In a further embodiment, the first metal layer is a nearest metal layer to the first surface of the first substrate. In an embodiment, the device also includes a bonding element connecting a second substrate to the first substrate. The bonding element may be connected to a top metal layer of the MLI. In another embodiment, a logic device is disposed on this second substrate and is electrically connected to the MLI of the first substrate. In another further embodiment, a wedge bond or a ball bond is attached to the pad element. A light sensing region may extend from the first surface of the first substrate into the first substrate.

In an embodiment, the pattern of conductive material includes a first conductive line defining a first shape and a second conductive line defining a second shape; the first and second shapes are concentric. In another embodiment, the pattern of conductive material includes a plurality of polygons defined by conductive lines.

In another of the broader embodiments, a method is provided that includes determining a layout of a bond structure. Determining this layer includes determining a bond pad region of a first metal layer. A first pattern of conductive material is provided in a first layer underlying the bond pad region. The first layer underlying the bond pad region has a conductive density of less than approximately 100%. A second pattern of conductive material in a second layer is provided underlying the first layer. The second layer also includes a conductive density of less than approximately 100%. However, the first pattern is different than the second pattern. Using this layout, a bond structure is fabricated on a semiconductor substrate.

In some embodiments, the method may further include providing the first pattern and the second pattern by determining a first pattern and a second pattern based on a planarization parameter of a chemical mechanical polish process to be performed on the first and second layers. One planarization parameter is a dishing effect of at least one of the first layer and the second layer. In some embodiments, a first pattern and a second pattern include at least one of performing a simulation and applying experimental data.

In summary, the methods and devices disclosed herein provide for bond structures including bond pads and the underlying conductive layers suitable for semiconductor devices such as image sensors. In doing so, the present disclosure offers several advantages over prior art devices. Advantages of the present disclosure include improved planarity in CMP processing of the bond structure and conductive layers. It is understood that different embodiments disclosed herein offer different disclosure, and that they may make various changes, substitutions and alterations herein without departing from the spirit and scope of the present disclosure.

What is claimed is:

1. A semiconductor device, comprising:
a light sensing region disposed on a substrate; and
a pad element coupled to the light sensing region, wherein the pad element is formed in a first metal layer disposed on the substrate;
a second metal layer disposed on the substrate and having a first region vertically underlying the pad element, wherein the first region of the second metal layer includes a first pattern of a plurality of conductive lines that define a first plurality of polygons including a first polygon and a second polygon, each polygon of the first plurality of polygons having N sides within a first plane defined by the second metal layer, wherein each polygon of the first plurality of polygons is concentric with one another,
wherein a first dielectric material is disposed in a first area enclosed by the first polygon, and
wherein a second dielectric material is disposed in a second area enclosed by the second polygon,
a first via vertically underlying the pad element and disposed on the first polygon, wherein a bottom surface of the first via physically contacts a top surface of the first polygon, and wherein the first polygon is electrically connected to the pad element by a first contiguous conductive path, wherein the first contiguous conductive path includes the first via,
wherein the second polygon is electrically connected to the pad element by a second contiguous conductive path;
a third metal layer disposed on the substrate and having a second region vertically underlying the pad element, wherein the second region of the third metal layer includes a second pattern of a plurality of conductive lines that define a second plurality of polygons, each polygon of the second plurality of polygons having one of N+1 sides and N−1 sides within a second plane defined by the third metal layer, wherein each polygon of the second plurality of polygons is concentric with one another; and
a second via connecting the second region of the third metal layer and the first region of the second metal layer.

2. The semiconductor device of claim 1, wherein
the first metal layer is disposed nearer a surface of the substrate than the second metal layer; and
the pad element is disposed on a peripheral region of the substrate.

3. The semiconductor device of claim 1, further comprising a wire bond attached to the pad element.

4. The semiconductor device of claim 1,
wherein the second pattern of the plurality of conductive lines is configured to define a plurality of enclosed areas in the second region.

5. The semiconductor device of claim 1, further comprising:
a top metal layer disposed on the substrate, wherein the top metal layer is disposed further from a substrate top surface than the first and second metal layers.

6. The semiconductor device of claim 5, further comprising:
a second substrate bonded to the top metal layer of the substrate having the light sensing region.

7. A back-side illuminated sensor device, comprising:
a first substrate having a first surface and an opposing second surface;
a lens disposed on the first surface, operable to direct an incident radiation beam toward a light sensing region disposed in the first substrate;
a multi-layer interconnect (MLI) disposed on the second surface of the first substrate, wherein the MLI includes a first metal layer, a second metal layer and a plurality of vias connecting the first and second metal layers; and
a bond structure disposed on a peripheral region of the first substrate, the bond structure including:
a pad element co-planar with the first metal layer of the MLI;
a first pattern of conductive material coplanar with the second metal layer of the MLI, wherein the first pattern vertically underlies the pad element and provides a first region vertically underlying the pad element that has a conductive density of less than 100%, wherein the first pattern of conductive material includes a first conductive ring and a second conductive ring nonconcentric with the first conductive ring, wherein a first dielectric material is disposed in a first area enclosed by the first conductive ring, and wherein a second dielectric material is disposed in a second area enclosed by the second conductive ring;
a first via vertically underlying the pad element and disposed on the first conductive ring, wherein a top surface of the first via physically contacts a bottom surface of the pad element, and wherein the first conductive ring is electrically connected to the pad element by a first contiguous conductive path, wherein the first contiguous conductive path includes the first via;
a second via vertically underlying the pad element and disposed on the second conductive ring, wherein a top surface of the second via physically contacts the bottom surface of the pad element, and wherein the second conductive ring is electrically connected to the pad element by a second contiguous conductive path including the second via;

a second pattern of conductive material coplanar with a third metal layer of the MLI, wherein the second pattern vertically underlies the pad element, and wherein the second pattern includes a third conductive ring and a fourth conductive ring nonconcentric with the third conductive ring, wherein a third dielectric material is disposed in a third area enclosed by the third conductive ring, and wherein a fourth dielectric material is disposed in a fourth area enclosed by the fourth conductive ring;

wherein the first and second conductive rings include N-sided polygons, and wherein the third and fourth conductive rings include M-sided polygons, M being different from N.

8. The back-side illuminated sensor device of claim 7, wherein the first metal layer is a nearest metal layer to the first surface of the first substrate; and the first and second conductive rings are vertically aligned with the pad element.

9. The back-side illuminated sensor device of claim 7, further comprising:
a bonding element connecting a second substrate to the first substrate, wherein the bonding element is connected to a top metal layer of the MLI.

10. The back-side illuminated sensor device of claim 9, further comprising:
a logic device disposed on the second substrate and electrically connected to the MLI of the first substrate.

11. The back-side illuminated sensor device of claim 7, at least one of a wedge bond and a ball bond attached to the pad element.

12. The back-side illuminated sensor device of claim 7, a light sensing region extending from the first surface of the first substrate into the first substrate.

13. The back-side illuminated sensor device of claim 7, wherein a first outer sidewall of the first conductive ring and a second outer sidewall of a second conductive ring are connected by a conductive path coplanar with the first and second conductive rings.

14. The back-side illuminated sensor device of claim 7, wherein the first and second conductive rings are connected by a conductive line coplanar with the first and second conductive rings.

15. The back-side illuminated sensor device of claim 7, the third metal layer of the MLI is adjacent to the second metal layer, and wherein a difference between N and M is greater than at least one.

16. A semiconductor device, comprising:
a light sensing region disposed in a first substrate, wherein the first substrate has a first surface and an opposing second surface;
a lens disposed over the first surface and aligned with the light sensing region;
a multi-layer interconnect (MLI) disposed over the second surface of the first substrate, wherein the MLI includes a first metal line nearest the second surface of the first substrate and a second metal line over the first metal line and nearer the second surface of the first substrate;
a pad element coplanar with the first metal line;
a metal feature vertically underlying the pad element and coplanar with the second metal line of the MLI, wherein the metal feature includes a first pattern of a plurality of conductive lines interposed by dielectric, and wherein the plurality of conductive lines includes:
a first set of conductive lines forming a plurality of first shapes; and
a second set of conductive lines forming a plurality of second shapes, wherein the plurality of first shapes and the plurality of second shapes are nonconcentric and arranged in an array, wherein the first shape is an N-sided polygon and the second shape is an M-sided polygons, M and N being different integers; and
a first via vertically underlying the pad element and disposed on a first conductive line of the first set of conductive lines, wherein a bottom surface of the first via physically contacts a top surface of the first conductive line, and wherein the first conductive line is electrically connected to the pad element by a contiguous conductive path including the first via,
wherein a second conductive line of the second set of conductive lines is electrically connected to the pad element by a second contiguous conductive path including a second via vertically underlying the pad element and disposed on the second conductive line; and
a top metal feature disposed on the first substrate, wherein the top metal feature is vertically aligned with the pad element, wherein the top metal feature includes a top pattern of a plurality of conductive lines interposed by dielectric, wherein the top pattern includes a first conductive ring and a second conductive ring coplanar with the first conductive ring, wherein the first and second conductive rings are nonconcentric, and wherein the top metal feature is bonded to a second substrate using a bonding element;
a second metal feature vertically underlying the pad element and coplanar with a third metal line of the MLI, wherein the second metal feature includes a second pattern of a plurality of conductive lines configured in a plurality of nonconcentric conductive circles.

17. The semiconductor device of claim 16, wherein a difference between N and M is greater than at least three.

18. The semiconductor device of claim 16, wherein a second bonding element is coplanar with the light sensing region.

19. The semiconductor device of claim 16, wherein the first and second shapes are a pair of polygons selected from the group consisting of a pair of pentagons and a pair of hexagons.

* * * * *